United States Patent
Barton et al.

(10) Patent No.: US 7,327,035 B2
(45) Date of Patent: Feb. 5, 2008

(54) SYSTEM AND METHOD FOR PROVIDING A LOW FREQUENCY FILTER POLE

(75) Inventors: Nathen Wainwright Barton, Richardson, TX (US); Chih-Ming Hung, McKinney, TX (US)

(73) Assignee: Texas Instruments Incorporated, Dallsa, TX (US)

( * ) Notice: Subject to any disclaimer, the term of this patent is extended or adjusted under 35 U.S.C. 154(b) by 0 days.

(21) Appl. No.: 10/936,407

(22) Filed: Sep. 8, 2004

(65) Prior Publication Data
US 2006/0049482 A1   Mar. 9, 2006

(51) Int. Cl.
*H01L 23/48* (2006.01)
*H03H 7/00* (2006.01)

(52) U.S. Cl. .............. 257/754; 257/924; 333/172; 333/181; 333/185

(58) Field of Classification Search .............. None
See application file for complete search history.

(56) References Cited

U.S. PATENT DOCUMENTS

| | | | |
|---|---|---|---|
| 4,479,100 A | 10/1984 | Moghe et al. | |
| 5,446,309 A | 8/1995 | Adachi et al. | |
| 5,886,393 A | 3/1999 | Merrill et al. | |
| 6,140,884 A | 10/2000 | Harpham et al. | |
| 6,194,774 B1 | 2/2001 | Cheon | |
| 6,459,343 B1 | 10/2002 | Miller | |
| 6,646,520 B2 | 11/2003 | Miller | |
| 6,949,988 B2 * | 9/2005 | Fallahi | 333/168 |

\* cited by examiner

*Primary Examiner*—David E Graybill
(74) *Attorney, Agent, or Firm*—Ronald O. Neerings; Wade James Brady, III; Frederick J. Telecky, Jr.

(57) ABSTRACT

Systems are provided for producing a low frequency filter pole. A first bond pad is coupled to a power source. A second bond pad is inductively connected to the first bond pad by a first bond wire. A capacitor is connected to the second bond pad. A third bond pad is inductively connected to the second bond pad by a second bond wire. The second bond wire, in conjunction with the capacitor, forms a low frequency filter pole to mitigate noise in a regulated signal provided at the third bond pad.

27 Claims, 4 Drawing Sheets

US 7,327,035 B2

SYSTEM AND METHOD FOR PROVIDING A LOW FREQUENCY FILTER POLE

TECHNICAL FIELD

The present invention relates generally to electrical circuits, and more particularly systems and methods for providing a low frequency filter pole.

BACKGROUND

A driving force today in the electronics industry is to provide the lowest cost solution while maintaining adequate performance. Accordingly, a designer generally seeks to balance between cost and performance. There are certain applications, including power supply systems, where extraneous noise in the power supply signal, such as a regulated voltage, can degrade performance below desired operating levels. One way to mitigate such noise is to provide a filter, such as including a low frequency pole.

Low frequency poles are usually implemented with RC networks as they can be more area efficient and usually have a lower cost of implementation. However, in some applications, such as filtering power signals, RC network filters are generally unsuitable because with their high series resistance, they cannot deliver power without a large voltage drop or active components. Additionally, RC networks can generate noise inside their passband. An alternative approach is to employ a network that includes active components, such as transistors, to implement desired filtering. Networks with active components, however, tend to be noisier than their passive counterparts, require a power supply, and are more sensitive to noise present on the power supply.

SUMMARY

In accordance with an aspect of the present invention, an apparatus is provided for producing a low frequency filter pole. A first bond pad is coupled to a power source. A second bond pad is inductively connected to the first bond pad by a first bond wire. A capacitor is connected to the second bond pad. A third bond pad is inductively connected to the second bond pad by a second bond wire. The second bond wire, in conjunction with the capacitor, forms a low frequency filter pole to mitigate noise in a regulated signal provided at the third bond pad.

In accordance with another aspect of the present invention, a regulated power supply system is provided. An external capacitor is electrically connected between a first node and electrical ground. A first bond wire, having an associated inductance, electrically connects the first node with a second node to provide a substantially regulated voltage at the second node. A second bond wire, having an associated inductance, electrically connects a third node with the first node so as to provide a low frequency filter pole based on a capacitance of the external capacitor and the associated inductance of the second bond wire.

BRIEF DESCRIPTION OF THE DRAWINGS

The foregoing and other aspects of the present invention will become apparent to those skilled in the art to which the present invention relates upon reading the following description with reference to the accompanying drawings.

DETAILED DESCRIPTION

Figure 1:
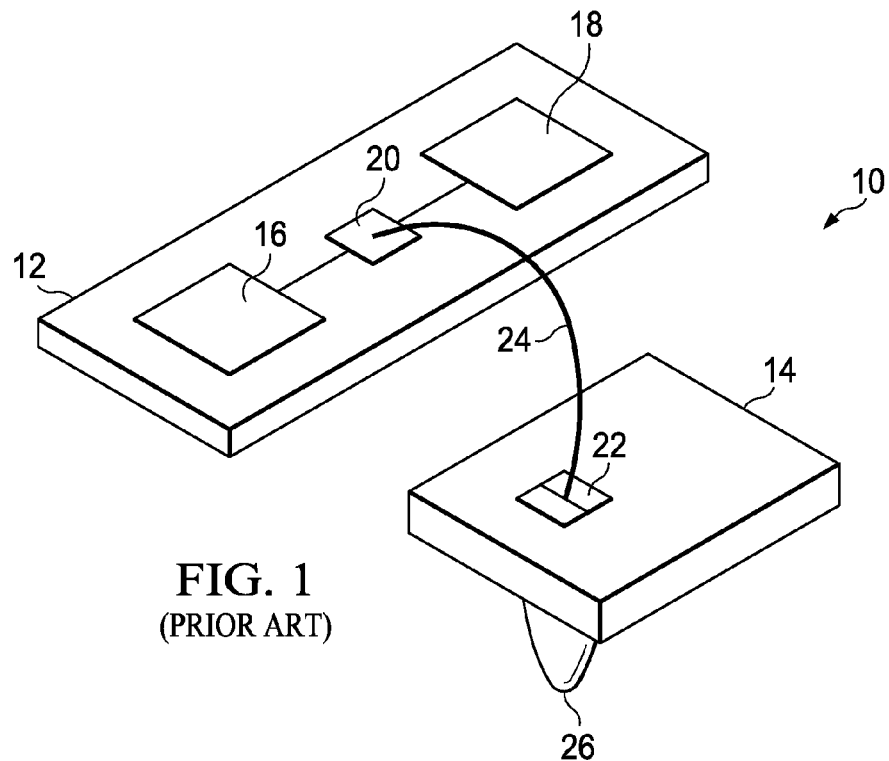
FIG. 1 illustrates an apparatus comprising a first substrate portion electrically connected to a second substrate portion.

FIG. 1 illustrates an apparatus 10 employing a conventional approach for interconnecting circuits. The apparatus includes a first substrate portion 12 electrically connected to a second substrate portion 14. It will be appreciated that the first and second substrate portions 12 and 14 can represent portions of a single substrate (or package) or portions of different substrates. As used herein, the substrate can correspond to a package for coupling an integrated circuit to a circuit board or to an assembly that includes a circuit board and package.

The first substrate portion 12 includes a first circuit 16 and a second circuit 18. The first and second circuits 16 and 18 are electrically connected along an electrically conductive circuit path, for example, by an integrated circuit trace. A first bond pad 20 is implemented on the circuit path between first and second circuits 16 and 18.

The first bond pad 20 provides a mechanism for connecting to a second bond pad 22, such as via a bond wire 24. This provides a parallel connection to the circuit path extending between the first bond pad 20 and the second bond pad 22. The second bond pad 22 can be electrically connected to a ground voltage through a capacitor or other circuitry (not shown) at a connector 26 (e.g., pin, solder ball). In one example, the first circuit 16 comprises a power source (e.g., battery or a voltage regulator) that provides a voltage along the circuit path to power the second circuit 18. The parallel path through the capacitor provides stability in the voltage provided by the circuit path, but allows high frequency noise to interfere with the voltage signal provided to circuitry of the second substrate portion 14.

Figure 2:
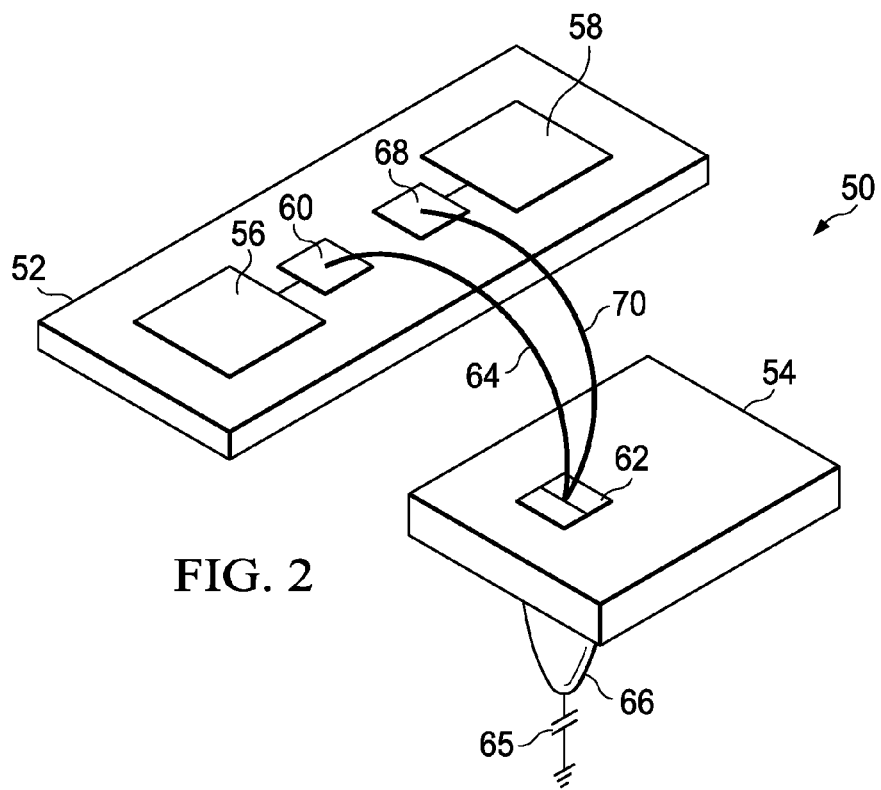
FIG. 2 illustrates a circuit apparatus in accordance with the present invention.

FIG. 2 illustrates an apparatus 50 implementing a low frequency filter pole in accordance with the present invention. The apparatus 50 includes a first substrate portion electrically connected to a second substrate portion 54. It will be appreciated that the first and second substrate portions 52 and 54 can represent portions of one substrate (e.g., an integrated circuit chip), circuit board or circuit board and package or portions of different substrates. The first substrate portion 54 includes a first circuit 56 and a second circuit 58. In accordance with an aspect of the present invention, the first circuit 56 is electrically connected with a first bond pad 60. The first bond pad 60 is connected to a second bond pad 62 via a bond wire 64 to provide a parallel connection from the circuit path to the second bond pad 62.

The first bond wire 64 has an inherent parasitic inductance, providing a first inductance associated with the apparatus 50.

The second bond pad 62 is electrically connected to a ground voltage through a capacitor 65. It will be appreciated that the capacitor 65 can be located on the second substrate 54 or it can be electrically connected to the second substrate. For example, as schematically illustrated in FIG. 2, the capacitor 65 can be connected to the second bond pad 62 through a connector 66 (e.g., pin, solder ball).

In an exemplary implementation, the first circuit 56 includes a power source (e.g., battery or a voltage regulator) that provides an output voltage to the bond pad 60, such as through an associated electrical trace or other integrated electrical connection. The second bond pad 62 is electrically connected to a third bond pad 68 via a second bond wire 70, having a second associated inductance. Accordingly, the first circuit 56 can provide a voltage to the second circuit 58, with the parallel path to ground through the capacitor stabilizing the voltage provided by the circuit path. As described herein, each of the bond pads 60, 62 and 68 defines a node that can be employed for interconnecting bond wires to associated circuitry.

In an alternative implementation, the capacitor 65 could be an integrated part of the substrate 52 according to an aspect of the present invention. For example, the capacitor 65 could be implemented as an external solid state capacitor electrically connected to the pad 68 or implemented in the integrated circuit 58.

In accordance with an aspect of the present invention, the configuration of the capacitor 65 and the second bond wire 70 forms a passive LC filter pole (e.g., a high-Q LC filter) for the path between the first circuit 56 and the second circuit 58. The frequency of this pole will be a function of the capacitance of the capacitor 65 and the associated inductance of the second bond wire 70. For example, the inductance of the bond wire 70 can be adjusted by varying the length of the wire or by employing a coiled wire. The frequency of the added LC filter pole can be derived from to the inductance of the second bond wire and the capacitance of the capacitor:

$$w_p = 1/\sqrt{LC}$$

where $w_p$ is the frequency of the added pole, L is the inductance of the second bond wire 70, and C is the capacitance of the capacitor 65.

By implementing the low frequency pole in this manner, phase noise can be mitigated, including high frequency noise associated with other circuitry (e.g., an oscillator) that is implemented on the same substrate 52 powered by the circuitry 56. It will be appreciated that the cost associated with implementing the low frequency filter to mitigate such noise is low compared to many existing approaches, such as those that employ solid state components to implement the filter. The approach described herein also can be achieved in a space efficient manner, as the low frequency pole can be provided through the addition of only a bond pad 68 and a bond wire 70.

Figure 3:
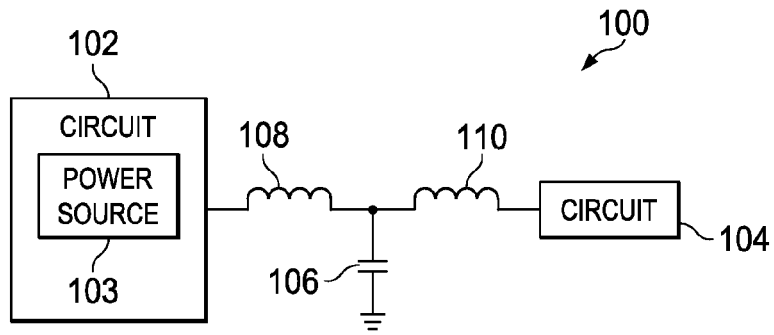
FIG. 3 illustrates a first exemplary filtering circuit that can be implemented in accordance with an aspect of the present invention.
Figure 4:
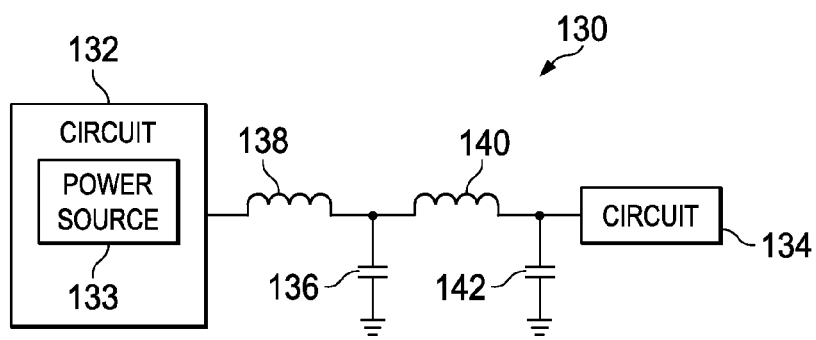
FIG. 4 illustrates a second exemplary filtering circuit that can be implemented in accordance with an aspect of the present invention.
Figure 5:
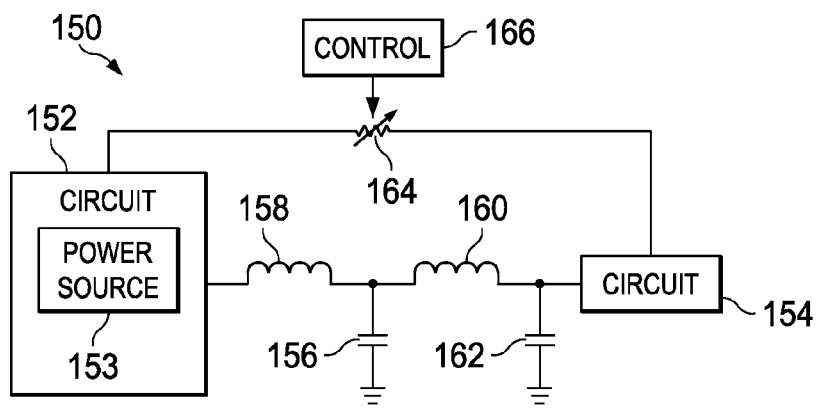
FIG. 5 illustrates a third exemplary implementation of a filtering circuit that can be implemented in accordance with an aspect of the present invention.

FIGS. 3-5 depict circuit representations of different exemplary filtering circuits that can be implemented in accordance with an aspect of the present invention. Those skilled in the art may appreciate other configurations that can be implemented based on the teachings contained herein, all of which are contemplated as falling within the scope of the appended claims.

FIG. 3 illustrates an example of a filtering system 100 that can be implemented in accordance with an aspect of the present invention. The filtering system 100 includes a first circuit 102 that includes or is associated with a power source 103. The first circuit 102 provides an output signal through a path for powering a second circuit 104. The path between the two circuits 102 and 104 forms the filtering system 100, and is connected to ground through a capacitor 106. As an example, the first circuit 102 and power source can be implemented as a low drop out voltage regulator, with the associated capacitor 106 providing stability in the regulated voltage that is being supplied to the second circuit 104.

The first circuit 102 is electrically connected to the capacitor 106 via a first bond wire 108 having an associated first inductance. In accordance with an aspect of the present invention, the capacitor 106 is connected to the second circuit via a second bond wire 110, having an associated second inductance. It will be appreciated that the configuration of the capacitor 106 and the second bond wire 110 provides an LC filter pole for the path between the first circuit 102 and the second circuit 104. The frequency of this pole will be a function of the capacitance of the capacitor 106 and the inductance of the second bond wire 110. It will be appreciated that these values can be controlled, within limits, to provide a low frequency filter pole for a filtering out noise below a desired frequency for the path between the two circuits 102 and 104.

The filtering system 100 can also be configured with the capacitor 106 being implemented as part of the circuit 102. For instance, the bond wire 108 can be implemented by a pair of bond wires, a first wire extending from a first terminal (e.g., a pad) of the circuit 102 to a bond pad and a second wire extending from the bond pad back to a second terminal of the circuit 102. In this alternative configuration, the capacitor 106 is electrically connected with the second terminal. The capacitor 106 can be an external solid state device connected directly to the circuit 102 or it can be integrated within an integrated circuit that forms the circuit 102.

FIG. 4 illustrates another exemplary filtering system 130 that can be implemented according to an aspect of the present invention. The system 130 is similar to that of FIG. 3, and further includes an additional low frequency pole. That is, the circuit 130 has a transfer function corresponding to a second order filter having two poles. In the illustrated implementation, a first circuit 132 includes or is otherwise associated with a power source 133 to provide power (e.g., a regulated voltage) to a second circuit 134. The path between the two circuits 132 and 134 is connected to ground through a first capacitor 136 associated with the first circuit. The first circuit 132 is connected to the first capacitor 136 via a first bond wire 138 having an associated first inductance. The capacitor 136 is connected to a bond pad that is associated with the second circuit 134 via a second bond wire 140, which has an associated second inductance. The inductance of the first and second bond wires 138 and 140 can be the same or different.

The system 130 includes a second parallel path to ground through a second capacitor 142. The second path can be provided along a circuit path (e.g., an integrated circuit trace) between the bond pad and the second circuit 134. The second capacitor 142 can be integrated into the second circuit 134 or be otherwise coupled to the same substrate in which the first and second circuits are implemented.

It will be appreciated that the addition of the second capacitor 136 to provides a second pole for the path between the first circuit 132 and the second circuit 134. The frequency for this filter pole will be a function of the capacitance of the second capacitor 142 and the inductance of the second bond wire 140. These values can be controlled, within limits, to provide poles at desired frequencies for the path between the two circuits 132 and 134. It will be appreciated as well that the second capacitor 142 can be used for purposes other than providing the described filter pole. For example, the second capacitor 142 can be used for decoupling purposes at the second circuit 134 to mitigate the effects of noise from the power supply.

In one implementation of the filtering circuit described in FIG. 4, the first capacitor 136 can be implemented as an external capacitor that serves to regulate power provided by the first circuit. By referring to the first capacitor 136 as an external capacitor, it is intended that the first capacitor 136 be located on a substrate or circuit board different from the substrate or circuit board containing the first circuit 132, although the capacitor 136 could be a solid state capacitor or it might be implemented as part of an integrated circuit. For example, to provide desired stabilization for voltage regulation, the first capacitor 136 can have a large associated capacitance and a correspondingly large surface area, thus making it desirable to implement the first capacitor as a solid state device located on a separate substrate (e.g., off chip) from the circuit 132. As mentioned above, the second capacitor 142 can be implemented on the same substrate associated with the first circuit, since it may to have a smaller capacitance and thus require a smaller associated surface area. Such a capacitor, configured in the described manner, would produce a filter pole having frequency above that of the pole associated with the external capacitor and the second bond wire 140. It will be appreciated that the use of multiple capacitors thus can be employed to provide a corresponding second order filter, which may provide improved filtering performance.

The filtering system 130 can also be constructed with the capacitor 136 implemented as part of the substrate that includes the circuit 132. For instance, the inductor 138 can include a pair of bond wires, in which a first wire extends from a first terminal of the circuit 132 to a bond pad (located on another substrate) and a second wire extends from the bond pad back to a second terminal of the circuit 132. The capacitor 136 could be an external solid state device directly connected to the second terminal of the circuit 132 or it can be implemented internally as part of an integrated circuit that includes the circuit 132 that is coupled to the second terminal.

FIG. 5 illustrates yet another example of a filtering circuit 150 that can be implemented in accordance with an aspect of the present invention. In the illustrated implementation, a first circuit 152 comprises a power source 153 that provides a voltage to a second circuit 154. A path between the two circuits 152 and 154 is connected to ground through a first capacitor 156 associated with the first circuit. The first circuit 152 is connected to the first capacitor 156 via a first bond wire 158 having an associated first inductance. The capacitor 156 is connected to a bond pad associated with the second circuit 154 via a second bond wire 160, having an associated second inductance. A second parallel path to ground between the bond pad and the second circuit 154 through a second capacitor 162 provides a second filter pole, in combination with the second bond wire 160.

In accordance with an aspect of the present invention, a second circuit path is provided between the first circuit 152 and the second circuit 154. For example, the circuit path can be provided as a circuit trace on a substrate containing the first and second circuits 152 and 154. The second circuit path contains a device (e.g., a variable resistor) 164 that can be selectively controlled by a control system 166 to assume one of at least two states, where each state provides a different effective resistance along the second circuit path. For example, the variable resistance device 164 can be implemented as a switch device, such as a transistor, coupled between the first and second circuits 152 and 154.

By way of example, the variable resistor 164 can be set to a state providing a low resistance path between bond pads of the respective circuits 152 and 154 to bypass or (or substantially remove) the filtering. The low resistance state of the device 164 can be implemented whenever bypassing the filtering circuit path may be beneficial. For example, it may be beneficial to bypass the filtering to avoid the long time constants that might exist during startup (e.g., time constant associated with load resistance of circuit 154 and the capacitor 156). To avoid "ringing" caused by the filter pole, the device 164 can be set to a state providing a higher resistance (e.g., corresponding to an open circuit) during steady state or normal operation. The resistance of the device 164 can be selectively controlled to mitigate ringing that might occur due to the filtering. In this manner, the device can provide an "anti-ringing" circuit.

Figure 6:
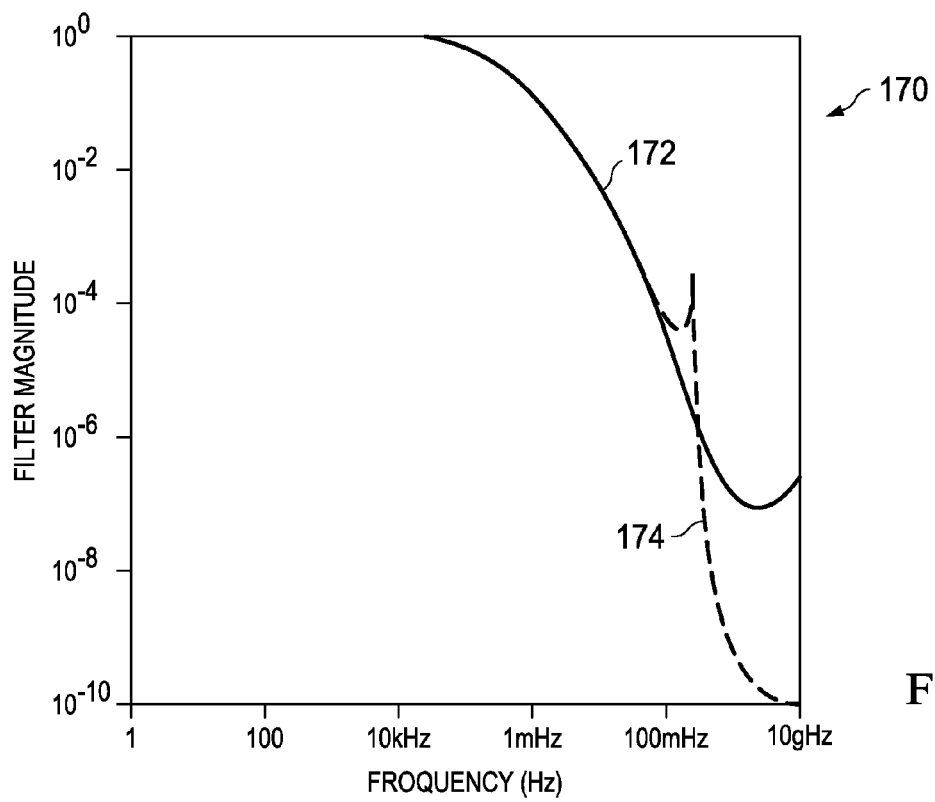
FIG. 6 is a graph illustrating the magnitude response of the filtering circuits illustrated in FIGS. 3 and 4.

FIG. 6 is a graph 170 illustrating the magnitude response of the filtering circuits illustrated in FIGS. 3 and 4. A first line 172 on the graph illustrates the effect of the low frequency pole created by the addition of the bond wire in the circuit of FIG. 3. The system shows significant attenuation at higher frequencies, beginning at a frequency of approximately 100 kHz. It will be appreciated, however, that the position of the filter pole will vary according to the capacitance and inductance, respectively, of the capacitor and bond wire used to implement the filter. The second line 174 represents the effect of a second order filter that includes a second pole introduced by the addition of a second capacitor, such as in the filter circuit 130 illustrated in FIG. 4. The second pole provides additional filtering at high frequencies, resulting in a marked increase in the attenuation created in the circuit for frequencies greater than 500 MHz.

Figure 7:
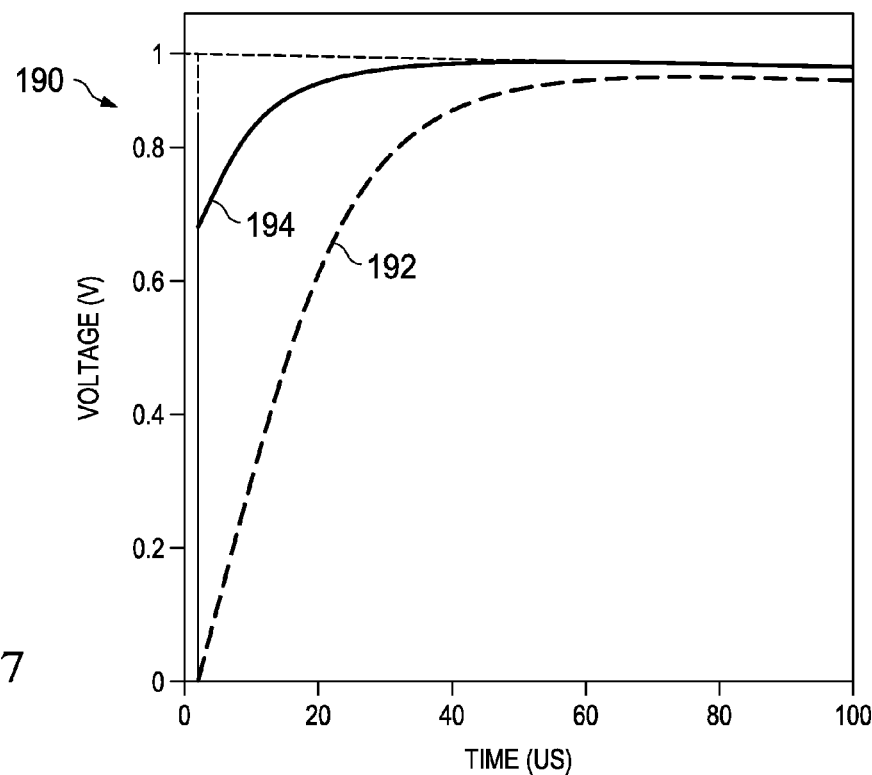
FIG. 7 is a graph illustrating the step response of the filtering circuit illustrated in FIG. 5.

FIG. 7 is a graph 190 illustrating the step response of the filtering circuit illustrated in FIG. 5. A first line 192 represents the response of the circuit during a transition period (e.g., during startup) when the variable resistor is maintained in a high resistance state. For instance, the LC filter 150 illustrated in FIG. 5 can have a large associated time constant due to the relatively large capacitance and associated load resistance (e.g., of the circuit 154 in FIG. 5) when the filter is implemented during a start-up phase. Accordingly, the circuit can require a considerable amount of time to pass a provided voltage at a desired capacity. It will be appreciated that the circuit would respond in a similar manner in the absence of the path containing the variable resistor in its high resistance state.

As discussed above, the variable resistor (e.g., 164 in FIG. 5) of the LC filter can be set to a low resistance state during transition periods to bypass the filter and mitigate the effects of the large time constants associated with the filter. A second line 194 of the graph in FIG. 7 thus represents the step response of the circuit during a transition period with the variable resistor in a low resistance state. It will be appreciated that the circuit takes significantly less time to reach the desired capacity when the variable resistor is activated to bypass the LC filter during such transitions in the output voltage.

Figure 8:
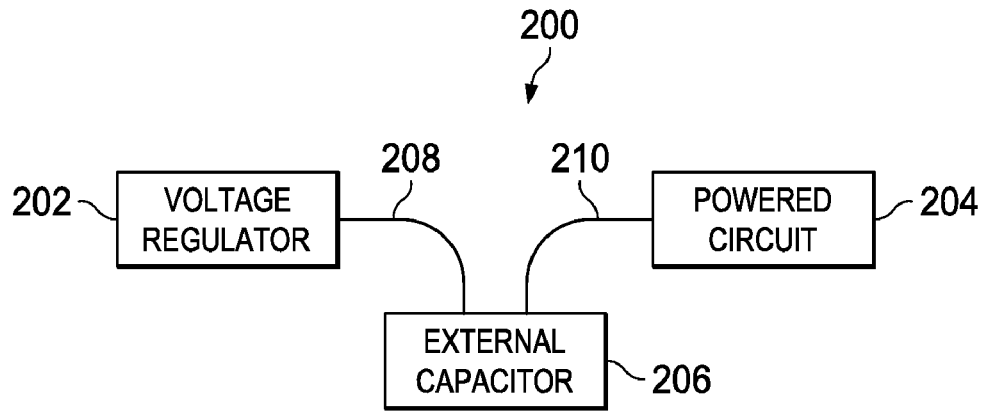
FIG. 8 illustrates a system comprising a voltage regulator that provides a voltage to an associated powered circuit in accordance with an aspect of the present invention.

FIG. 8 illustrates a system 200 comprising a low drop out voltage regulator 202 that provides a voltage to an associated powered circuit 204. In the illustrated example, the voltage regulator 202 and the powered circuit 204 can be implemented together on a first substrate (e.g., integrated circuit chip). An external capacitor 206, having a large associated capacitance, can be implemented (as a solid state device) on a second substrate to conserve area on the first substrate. The voltage regulator 202 can be electrically connected to ground through the external capacitor 206 via a first bond wire 208. The first bond wire 208 has a parasitic inductance. The connection to ground through the external capacitor has a stabilizing effect on the voltage provided by the voltage regulator 202.

In accordance with an aspect of the present invention, the presence of the external capacitor 206 can be utilized to provide additional filtering to the circuit path between the voltage regulator 202 and the powered circuit 204. To this end, the voltage from the voltage regulator 206 can be provided to the powered circuit 204 through a second bond wire 210 connecting the capacitor path to the powered circuit. The addition of the second bond wire 210, as opposed to a circuit trace or other connection, adds a characteristic parasitic inductance to the path of the supplied voltage. This increased parasitic inductance, in conjunction with the large capacitance of the external capacitor, provides an additional low frequency filter pole associated with the circuit path.

Figure 9:
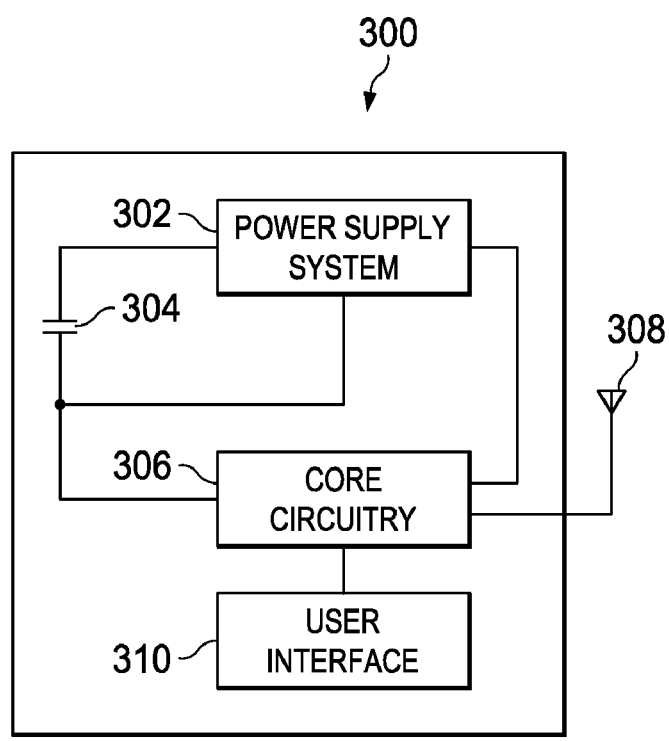
FIG. 9 depicts an example of a portable electronic apparatus.

FIG. 9 depicts an example of an electronic apparatus 300, such as a cellular telephone, personal digital assistant, portable computer and the like, implementing a power supply system 302 according to an aspect of the present invention. Those skilled in the art will understand and appreciate various implementations for the power supply system 302 based on the teachings contained herein, including but not limited to those shown and described with respect to FIGS. 2-6.

The power supply system 302 is coupled to a battery 304 for converting an input voltage from the battery to a desired regulated voltage level. The power supply system 302 provides regulated power (e.g., regulated voltage or current) to associated core circuitry 306. The regulated power can vary based on the input impedance of the core circuitry of the apparatus 300. The core circuitry 306 can include analog or digital components configured and/or programmed to implement the functionality of the particular type of apparatus 300 being implemented. In the example of FIG. 7, the core circuitry 306 is coupled to an antenna 308, such as for transmitting or receiving wireless communication signals, although the power supply system can be utilized in any electronic device. A user interface 310 (e.g., including a keypad, touch-screen, microphone, etc.) can also be coupled to the core circuitry 306 for providing input instructions from a user to the core circuitry.

By way of example, the apparatus 300 can operate in a plurality of operating modes, including at least a low power sleep mode and an active (or normal) mode. The power supply system 302 is configured to provide stable power to the core circuitry 306. As described herein, the power supply system 302 includes a low frequency filter pole that mitigates low frequency oscillations in the power (e.g., voltage or current) being supplied to the core circuitry 306. As a result, variations in the electrical characteristics in the electrical power supplied to the core circuitry 306 can be mitigated.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. For example, a plurality of low frequency poles can be implemented for a given integrated circuit chip or electronic device, such as by adding an additional pad and bond wire at each circuit location where the pole is desired. Accordingly, the present invention is intended to embrace all such alterations, modifications, and variations that fall within the spirit and scope of the appended claims.

What is claimed is:

1. An apparatus for producing a low frequency filter pole to mitigate noise in a power signal, comprising:
    a first electrically conductive pad coupled to receive power;
    a second electrically conductive pad;
    a first wire that inductively connects the first bond pad to the second pad;
    a first capacitor connected to the second pad;
    a third electrically conductive pad; and
    a second wire that inductively connects the second pad to the third pad, the second wire and the capacitor forming a low frequency filter.

2. The apparatus of claim 1, wherein the first capacitor is external relative to a substrate that includes the first and third bond pads.

3. The apparatus of claim 2, further comprising a second capacitor coupled to the third pad.

4. The apparatus of claim 3, the second capacitor being implemented on the substrate that includes the first pad and the third pad.

5. The apparatus of claim 3, wherein a capacitance of the second capacitor is less than an associated capacitance of the first capacitor.

6. The apparatus of claim 1, further comprising a variable resistance path connecting the first and third pads.

7. The apparatus of claim 6, further comprising a control system that selectively controls the variable resistance path to enter a low resistance state that substantially removes at least the low frequency pole from a path between the first and third pads.

8. The apparatus of claim 6, the variable resistance path comprising a switch device.

9. The apparatus of claim 1, further comprising a voltage regulator that is configured to provide the power signal as a regulated voltage.

10. The apparatus of claim 1, wherein the first pad is external relative to a substrate from which the power is provided, the second pad corresponding to a terminal of a first integrated circuit that includes the first capacitor.

11. The apparatus of claim 10, further comprising:
    a third wire that electrically connects the third pad to a fourth pad corresponding to a terminal of a second integrated circuit; and
    a second capacitor electrically coupled to the fourth pad, such that the third wire and second capacitor cooperate with at least the second wire and the first capacitor to form at least a second order low frequency filter.

12. The apparatus of claim 1, wherein the first capacitor is one of external to and an integrated part of a substrate that includes the first pad and the third pad.

13. A portable electronic device comprising the apparatus of claim 1, the electronic device further comprising at least one battery that is employed to provide the power.

14. The device of claim 13, further comprising a voltage regulator that is configured to provide the power signal as a regulated voltage, the low frequency filter pole being configured to mitigate noise in the regulated voltage.

15. A regulated power supply system, comprising:
- an external capacitor electrically connected between a first node and electrical ground;
- a first bond wire that electrically connects the first node with a second node; and
- a second bond wire that electrically connects a third node with the first node to provide a substantially regulated voltage at the third node, the external capacitor and the second bond wire forming a low frequency pole that mitigates high frequency noise in the regulated voltage at the third node.

16. The system of claim 15, further comprising a substrate that includes the second and third nodes, the capacitor being external relative to the substrate.

17. The system of claim 16, wherein the second and third nodes comprise respective first and second bond pads, the first node comprising a third bond pad that is part of a different substrate from the substrate that includes the first and second bond pads.

18. The system of claim 15, further comprising a second capacitor coupled to the third node.

19. The system of claim 18, wherein an associated capacitance of the second capacitor is less than an associated capacitance of the external capacitor.

20. The system of claim 15, further comprising a parallel path that connects the second and third nodes through a variable resistor.

21. The system of claim 20, further comprising a control system that controls the variable resistor to transition from a first state having a first resistance to a second state having a second resistance that is lower than the first resistance for selectively bypassing the low frequency filter pole between the second node and the third node.

22. A portable electronic device comprising the system of claim 15, the electronic device further comprising at least one battery that provides power for the power supply system.

23. A regulated power supply system, comprising:
- means for providing a substantially regulated voltage across a capacitor that is coupled to a first bond pad;
- means for inductively connecting the first bond pad with a second bond pad so as to provide a low frequency filter pole based on a capacitance of the capacitor and an inductance of the means for inductively connecting.

24. The system of claim 23, further comprising means for selectively electrically removing the low frequency filter pole from the power supply system.

25. The system of claim 23, wherein the capacitor is one of internal and external relative to a substrate that includes the first bond pad.

26. The system of claim 23, in which the means for providing is located on a first substrate and the capacitor is located on a second substrate.

27. The system of claim 26, further comprising means for capacitively coupling, associated with the first substrate, that provide a second filter pole based on an associated capacitance of the means for capacitively coupling and the inductance of the means for inductively connecting.

* * * * *